United States Patent [19]

Shibata et al.

[11] 4,441,198
[45] Apr. 3, 1984

[54] SHIFT REGISTER CIRCUIT

[75] Inventors: Jun Shibata, Sakai; Haruyasu Yamada, Hirakata; Toshiki Mori, Ibaraki; Toyoki Takemoto, Yawata, all of Japan

[73] Assignee: Matsushita Electric Industrial Co., Ltd., Osaka, Japan

[21] Appl. No.: 275,848

[22] Filed: Jun. 22, 1981

[30] Foreign Application Priority Data

Jun. 26, 1980 [JP] Japan .................................. 55-87290
Jun. 26, 1980 [JP] Japan .................................. 55-87291

[51] Int. Cl.³ .................... G11C 19/28; H03K 19/173
[52] U.S. Cl. ..................................... 377/78; 307/477; 377/72; 377/81
[58] Field of Search ............... 307/443, 445, 459, 477, 307/480, 247 A, 272 A, 291; 377/28, 54, 70–73, 78, 81, 119, 120

[56] References Cited

U.S. PATENT DOCUMENTS

| | | | |
|---|---|---|---|
| 3,636,376 | 1/1972 | Hoffmann | 307/480 X |
| 3,725,792 | 4/1973 | Kellogg | 307/443 X |
| 4,085,341 | 4/1978 | Reinert | 307/459 X |
| 4,160,173 | 7/1979 | Aoki | 307/480 X |
| 4,209,715 | 6/1980 | Aoki | 307/459 X |

Primary Examiner—Larry N. Anagnos
Assistant Examiner—David R. Hudspeth
Attorney, Agent, or Firm—Stevens, Davis, Miller & Mosher

[57] ABSTRACT

A first logic circuit comprises coupling gate circuits driven by clock pulses of different phases, flip-flop circuits cascade-connected via the coupling gate circuits and feedback circuits for feeding back the outputs of the flip-flop circuits to the preceding stage flip-flop circuits, and generates pulse sequences of different phases. A second logic circuit further comprises latch circuits one for each of the flip-flop circuits, driven by the pulse sequences generated by the first logic circuit. Those logic circuits are useful to a successive approximation register of a successive approximation A/D converter.

6 Claims, 14 Drawing Figures

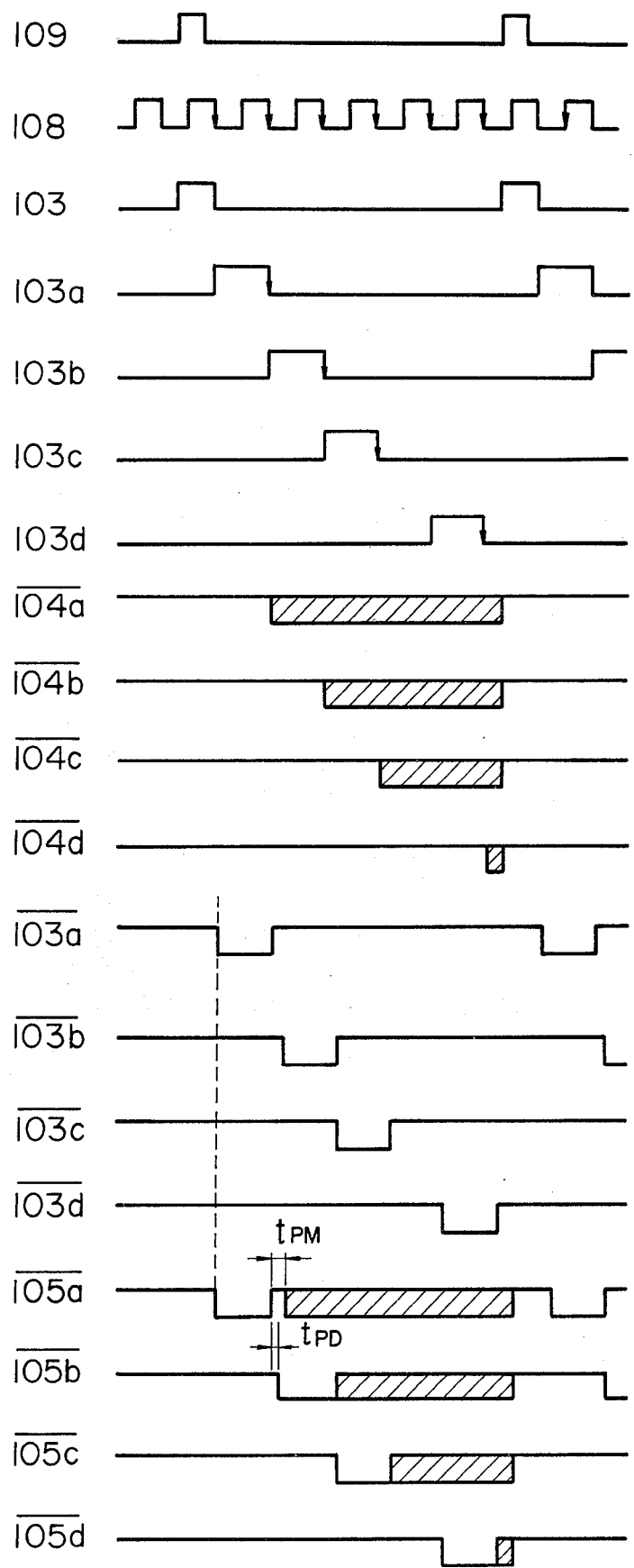

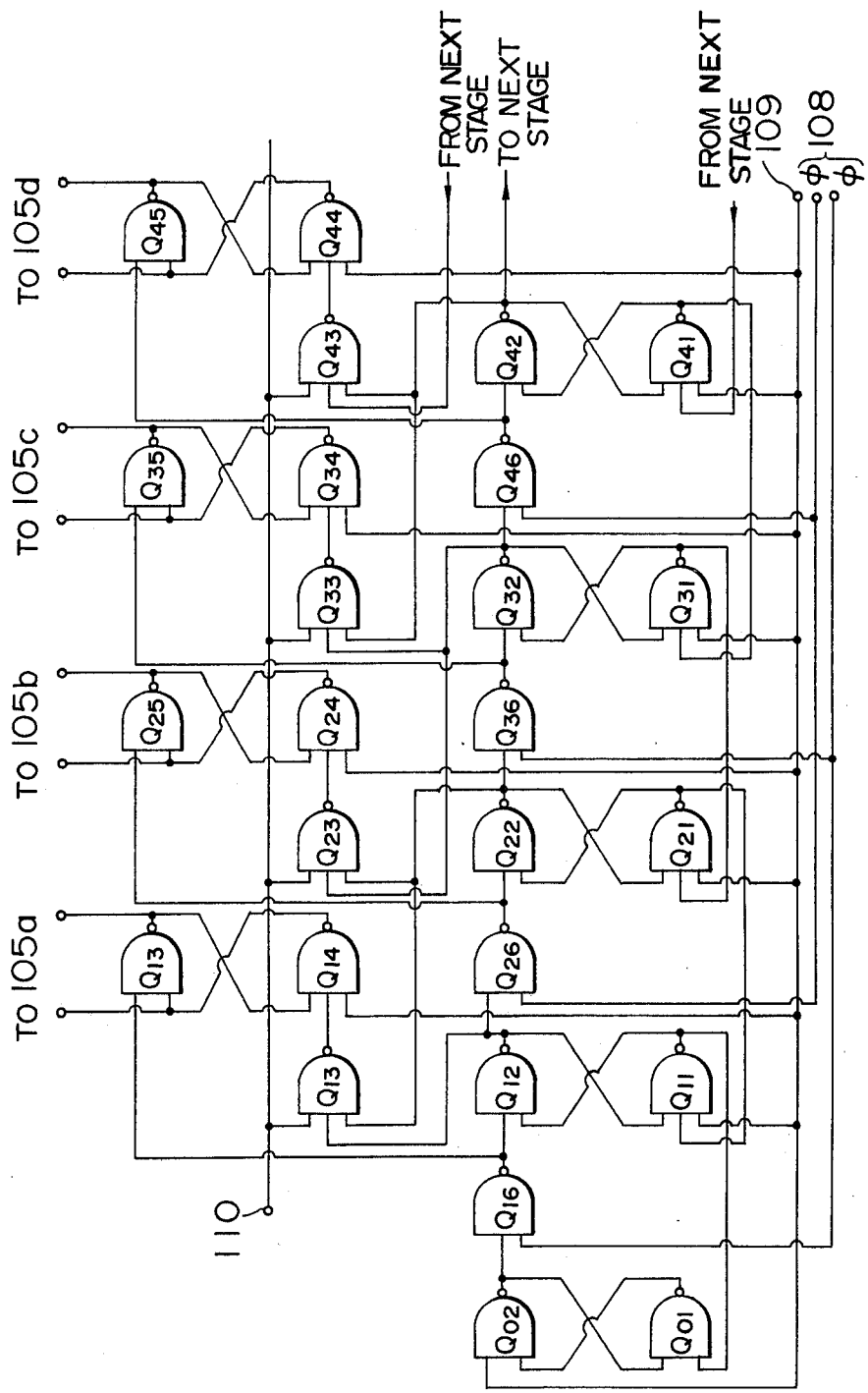
F I G. 14

SHIFT REGISTER CIRCUIT

BACKGROUND OF THE INVENTION

The present invention relates to a logic circuit which generates pulse sequences of different phases.

Technologies for digitizing an analog signal to facilitate signal processing or to process the digital signal by a computer have made remarkable progress by recent semiconductor technology, particularly LSI technology. Among others, an analog-to-digital converter (A/D converter) which serves as an interface of the analog signal and the digital signal has changed from a module type or hybrid type to a faster and more accurate monolithic IC. A successive-approximation type monolithic A/D converter has been vigorously developed.

As shown in FIG. 1, the successive-approximation type A/D converter comprises an input span resistor ($R_i$) 101, a comparator 102, shift counters 103 (103a–104d) and current-steering switches 105 (105a–105d) including binary weighted current sources. The shift counters 103 and the memories 104 constitute a successive approximation resistor (SAR). A sampling and hold signal $V_i$ is applied to an input terminal 106, a reference voltage $V_s$ is applied to a terminal 107, and a clock pulse and a reset pulse are applied to a terminal 108 and a terminal 109, respectively. Numeral 110 denotes an output line of the comparator 102, numeral 111 denotes an output current summing line and numeral 112 denotes digital output lines of the memory 104.

In the operation of the comparator, shift pulses are sequentially applied from the shift counters 103a, 103b, 103d to the memories 104a, 104b, ... 104d so that the current-steering switches 105a, 105b, ... 105d having weights of $\frac{1}{2}^1, \frac{1}{2}^2, \ldots \frac{1}{2}^n$, respectively, are sequentially turned on. The output pulse of the counter 103a is first applied to the memory 104a to turn on the switch 105a to supply a current $I_o$ to the summing line 111 and the comparator 102 compares ($V_i - R_i I_o$) with $V_s$. If ($V_i - R_i I_o) > V_s$, "1" is stored in the memory 104a. Then, the output pulse of the counter 103b is applied to turn on the switch 105b to supply a current $I_o/2$ to the summing line 111. The switch 105a is also turned on by the content (stored "1") of the memory 104a to supply the current $I_o$ to the summing line 111. As a result, a total current of ($I_o + I_o/2$) is supplied to the summing line 111. The comparator 102 compares $V_i - (I_o + I_o/2)R_i$ with $V_s$ and stores the compare result in the memory 104b. Similarly, the compare results of the comparator 102 are stored in the memories 104c, ... 104d to produce the digital output 112.

The SAR comprising the shift counters 103 and the memories 104 used in the successive approximation type A/D converter may be constructed as shown below.

FIG. 2 shows an example of the SAR which comprises D-type flip-flop (D-type F-F).

In FIG. 2, like numerals to those shown in FIG. 1 denote like elements, and numerals 1030, 103a, ... 103d and 104a ... 104d denote D-type F-F's Each of the D-type F-F's comprises six NAND gates. FIG. 3 shows waveforms at various points in FIG. 2 and the numerals corresponding to those in FIG. 2 denote the corresponding output waveforms. In the illustrated example, the D-type F-F's are triggered by trailing edges. The operation is explained below. When the reset pulse 109 is applied, the D-type F-F 1030 is set while all other D-type F-F's are reset. Accordingly, under this condition a Q-output of the D-type F-F 1030 assumes an "H" level. At a trailing edge of the next clock pulse 108, the D-type F-F 103a reads in the "H" level at its D-input. At a trailing edge of the next sequential clock pulse, the D-input of the D-type F-F 103a is "L" and hence a Q-output thereof is "L". On the other hand, the D-type F-F 103b assumes the "H" level. In a similar manner, shift pulse sequences as shown by 103a, 103b, ... 103d in FIG. 3 are produced.

On the other hand, the memories 104a, 104b, ... 104d are clocked by the corresponding shift pulses. Consequently, the D-type F-F 104a reads in its D-input which is "H" or "L" level of the comparator output 110 at the trailing edge of the output of the D-type F-F 103a so that the D-type F-F's 104a ... 104d produce Q-outputs as shown by 104a ... 104d in FIG. 3. Hatched areas show conditions responding to the output of the comparator 102. The current-steering switches are driven by wired-OR signals of $\bar{Q}$-outputs of the memory D-type F-F's 104a ... 104d and $\bar{Q}$-outputs of the shift counter D-type F-F's 103a ... 103d, that is, signals 105a, 105b, 105c and 105d.

A defect of the SAR comprising a D-type F-F is an operational delay in the D-type F-F's as shown in FIG. 3. At the trailing edge of the D-type F-F 103a, the D-type F-F 104a is triggered, but a gate delay occurs because the D-type F-F usually comprises a plurality of NAND gates. Consequently, a time delay $t_{PM}$ occurs before the D-type F-F 104a produces the $\bar{Q}$-output in response to the trailing edge of the D-type F-F 103a. Similar time delays occur between the clock pulse 108 and the output shift pulse sequencies of the D-type F-F's 103a ... 103d. Relative time delay thereof is represented by $t_{PD}$. If the output of the comparator is "L" no time delay $t_{PM}$ occurs between the shift pulse and the memory output, but if the output of the comparator is "H", the time delay or gap $t_{PM}$ significantly deteriorates the accuracy. If the gap occurs for the most significant bit (MSB), the current-steering switch is turned off when the shift pulse changes from "L" to "H" as shown by $\overline{105a}$ to $\overline{105d}$ of FIG. 3. Thereafter, the current-steering switch corresponding to the second bit is turned on by the shift pulse corresponding to the second bit. When the MSB memory assumes the "L" level after the time delay $t_{PM}$, the current-steering switch corresponding to the MSB is again turned on. Thus, the current of the highest weight varies significantly in a very short time period. This is called glitch which causes ringing in an analog circuit and causes a longer settling time and a conversion error.

A second defect is a large number of gates required in the SAR. This is disadvantageous in the design of the monolithic IC in view of chip size and power dissipation.

On the other hand, instead of the D-type F-F arrangement shown in FIGS. 2 and 3, the shift counter of the SAR may be constructed by a synchronous counter and AND gates as shown in FIG. 4, in which numerals 401 and 402 denote T-type F-F's and numerals 403 to 407 denote AND gates. The like numerals to those in FIG. 1 denote the like elements. Symbols A, $\bar{A}$ of 401 and B, $\bar{B}$ of 402 denote outputs of different phases, respectively.

FIG. 5 shows a time chart for the shift pulse sequence generating circuit shown in FIG. 4. The numerals corresponding to those shown in FIG. 4 denote the corresponding output waveforms.

In the example shown in FIG. 4, as is apparent from FIG. 5, the width of each of the shift pulses is equal to a period T of the clock pulse as a result of the use of the synchronous counter. However, the pulse interval of the shift pulse sequence is not always an integer multiple of T and hence errors occur in the gate delay times $t_g$ of the T-type F-F's 401 and 402, where $t_g$ is a delay time per gate of the NAND gates of the T-type F-F's 401 and 402 (to be explained with reference to FIG. 6) and the AND gates 403 to 407. In a system which operates in synchronism with time T, for example, an A/D converter, the fluctuation in time of the shift pulse sequence due to the gate delay time $t_g$ is a kind of noise and causes a jitter distortion.

In the construction shown in FIG. 4, the T-type F-F comprises NAND gates 601, a resistor 602 and a capacitor 603, as shown in FIG. 6. It is similar to an Eccles-Jordan flip-flip. A clock pulse is applied to a terminal $\overline{T}$ and a set pulse and a reset pulse are applied to terminals $\overline{S}$ and $\overline{R}$, respectively. However, the T-type F.F blocks the realization of a high integration density IC because it uses R-C elements. Accordingly, a master-slave type J-K F-F which has more general applications is frequently used.

FIG. 7 shows a basic circuit of the master-slave type J-K F-F. In FIG. 7, numeral 701 denotes NAND gates and numeral 702 denotes AND gates. In order to use the J-K F-F as the T-type F-F, a J-K terminal is kept at the "H" level and a clock pulse is applied to a terminal $C_p$. However, since the J-K F-F requires eight gates per pulse, it blocks the IC implementation.

As described thus far, a logic circuit which is fully satisfactory to the monolithic IC implementation of the SAR for the high speed and high accuracy sequential approximation type A/D converter has not been provided.

SUMMARY OF THE INVENTION

It is a first object of the present invention to provide a logic circuit which is simple in construction, fast in operation speed, is free of jitter in pulse sequence and is ready to fabricate in a high integration density IC chip, which logic circuit comprises a plurality of coupling gate circuits each driven by a clock pulse of different phase from others, a plurality of flip-flop circuits cascade-connected via the coupling gate circuits and a plurality of feedback circuits for feeding back the outputs of the flip-flop circuits to the preceding flip-flop circuits.

It is a second object of the present invention to provide a logic circuit which is simple in construction, is free from jitter and is ready to fabricate in a high integration density IC chip, which logic circuit comprises a plurality of coupling gate circuits each driven by a clock pulse of different phase from the others, a plurality of flip-flop circuits cascade-connected via the coupling gate circuits, a plurality of feedback circuits for feeding back the outputs of the flip-flop circuits to the preceding flip-flop circuits, and latch circuits provided one for each of the flip-flop circuits and driven by the outputs of the corresponding flip-flop circuits. Since a long write time for the latch circuits is permitted, the logic circuit has a stable memory function.

BRIEF DESCRIPTION OF THE DRAWINGS

FIG. 3 shows operational waveforms of the circuit of FIG. 2.

FIG. 14 shows a circuit diagram of a fifth embodiment of the logic circuit of the present invention.

DESCRIPTION OF THE PREFERRED EMBODIMENTS

Figure 8:
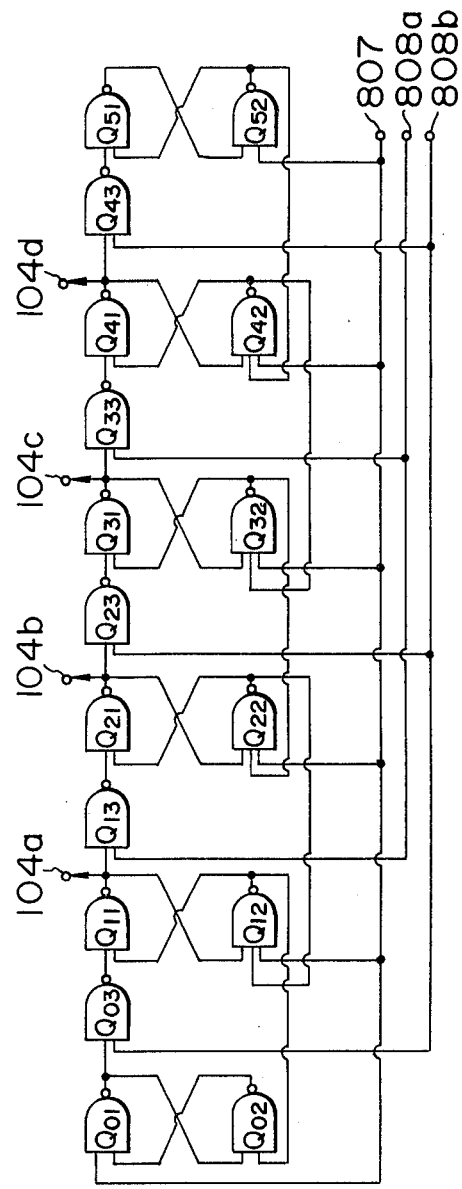
FIG. 8 shows a circuit diagram of a first embodiment of a logic circuit of the present invention.

FIG. 8 shows a circuit diagram of a first embodiment of the logic circuit of the present invention which produces a jitter free shift pulse sequence. In FIG. 8, flip-flops ($Q_{01}$, $Q_{02}$), ($Q_{11}$, $Q_{12}$), ... ($Q_{51}$, $Q_{52}$) are conventional R-S F-F's which are cascade-connected via NAND gates $Q_{03}$, $Q_{13}$, ... $Q_{43}$. The output signals of the R-S F-F's are fed back to the respective preceding R-S F-F's. Numeral 807 denotes a reset pulse input terminal and numerals 808a and 808b denote clock pulse input terminals to which clock pulses of different phase to each other are applied. The R-S F-F comprising $Q_{51}$ and $Q_{52}$ is a flip-flop for sending a feedback signal to the preceding R-S F-F. The R-S F-F comprising $Q_{01}$ and $Q_{02}$ is not necessarily provided but it functions to match the pulse width of the output from $Q_{11}$ to a clock pulse period.

Figure 9:
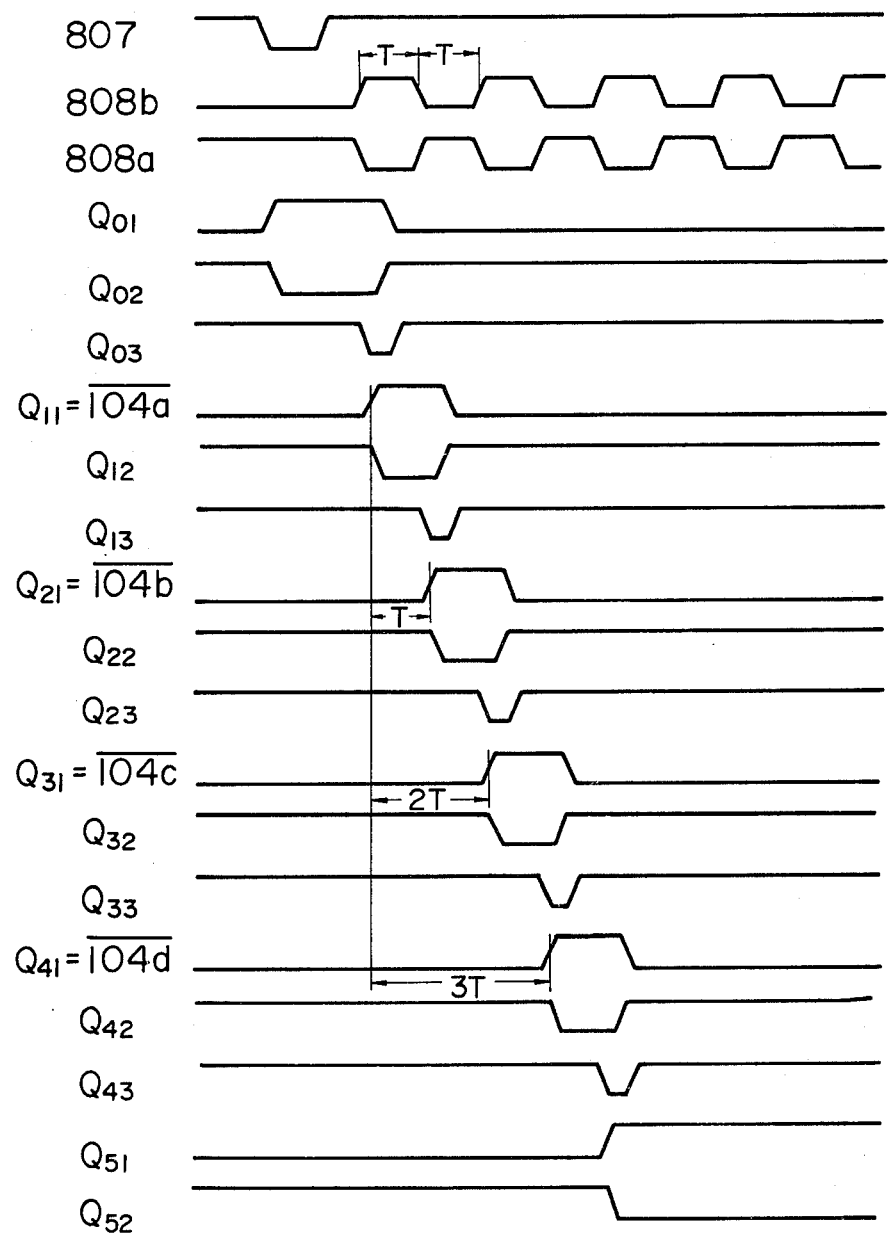
FIG. 9 shows operational waveforms of the circuit of the first embodiment.

FIG. 9 shows operational waveforms of the first embodiment shown in FIG. 8 and the numerals corresponding to those shown in FIG. 8 denote the corresponding output waveforms.

The operation of FIG. 8 is now explained with reference to FIG. 9.

When the reset pulse 807 changes from the "H" level to the "L" level, $Q_{01}$ and $Q_{02}$ of the R-S F-F's are set while others are all reset. That is, the output signals of $Q_{12}$, $Q_{22}$, $Q_{32}$, $Q_{42}$ and $Q_{52}$ are of "H" level. Under this condition, when the clock pulse at the terminal 808b changes from "L" to "H", the output signal of $Q_{03}$ changes from "H" to "L". As a result, the output signal of $Q_{11}$ changes from "L" to "H" and then the output signal of $Q_{12}$ changes from "H" to "L". The change of the output signal of $Q_{12}$ to the "L" level is fed back to $Q_{02}$ so that the output signal of $Q_{02}$ changes from the "L" level to the "H" level and then the output signal of $Q_{01}$ changes from the "H" level to the "L" level. As the output signal of $Q_{01}$ changes to the "L" level, the gate $Q_{03}$ is closed. After the clock pulse width of T seconds, the clock pulse at the terminal 808 changes from "L" to "H" so that the gate $Q_{13}$ is opened to flip $Q_{21}$ and $Q_{22}$. The change of the output signal of $Q_{22}$ from the "H"

level to the "L" level is fed back to $Q_{12}$, the output signal of which changes from "L" to "H" so that $Q_{11}$ flips and $Q_{13}$ is closed. Similar operations are repeated until $Q_{53}$ flips, where the change of status is withheld until the next reset pulse is applied.

In the present embodiment, the shift pulse width is defined by the input clock pulse as is done in the synchronous counter while the jitter of the shift pulse sequence which is the defect encountered in the synchronous counter is resolved by feeding back the reset pulse sequentially to the preceding stages so that the pulses are arranged at a time interval of T seconds. Thus, a jitter free shift pulse sequence of any desired length can be produced by three gates per pulse. The gates $Q_{01}$ and $Q_{02}$ are not necessarily provided. However, as shown in FIG. 9, when the reset pulse 807 is not in phase with the clock pulses at the terminals 808a and 808b, the pulse width of the output signal of $Q_{01}$ is not equal to the clock pulse width T. Accordingly, the R-S F-F comprising $Q_{01}$ and $Q_{02}$ functions as a timing buffer which eliminates the need for a specific timing relation between the reset pulse 807 and the clock pulses at the terminals 808a and 808b.

Figure 1:
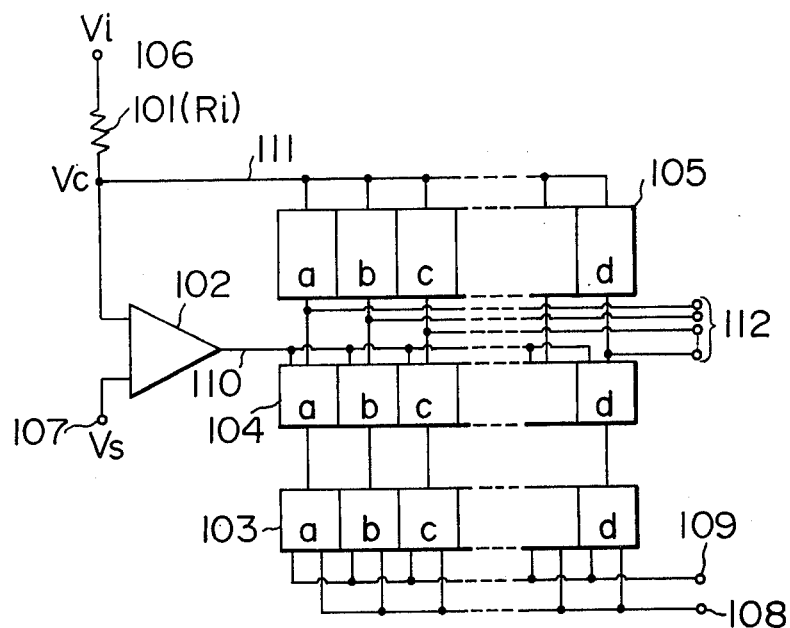
FIG. 1 shows a configuration of a successive approximation type A/D converter.
Figure 4:
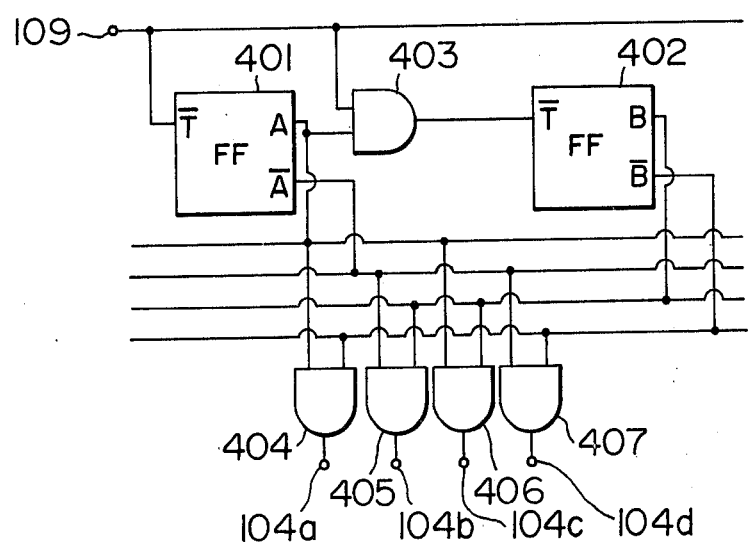
FIG. 4 shows a logic circuit using a synchronous counter for generating a shift pulse sequence.
Figure 2:
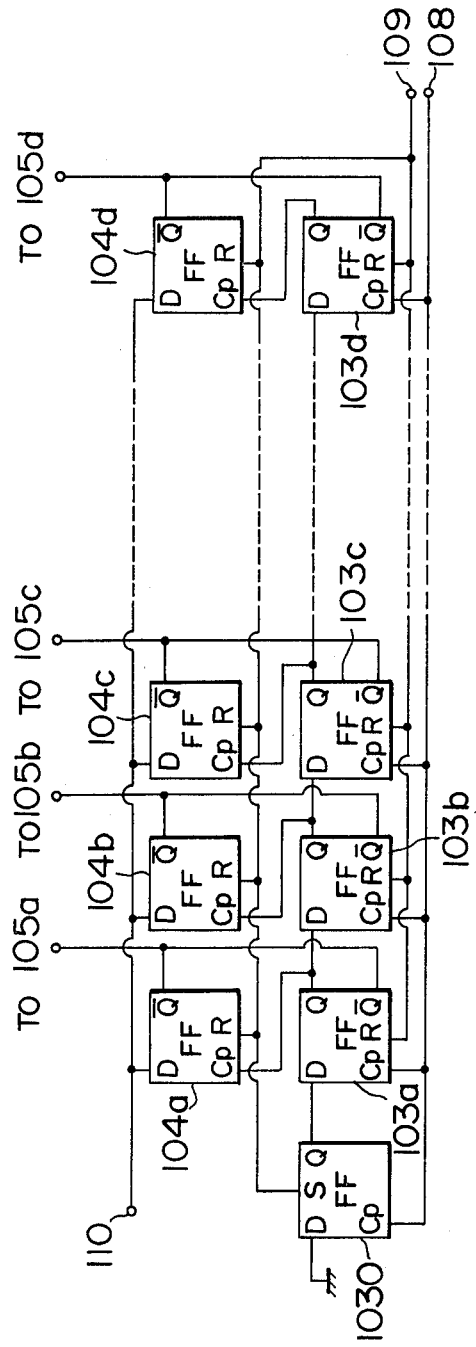
FIG. 2 shows a circuit diagram of an SAR which uses D-type F-F's as a basic circuit element.
Figure 5:
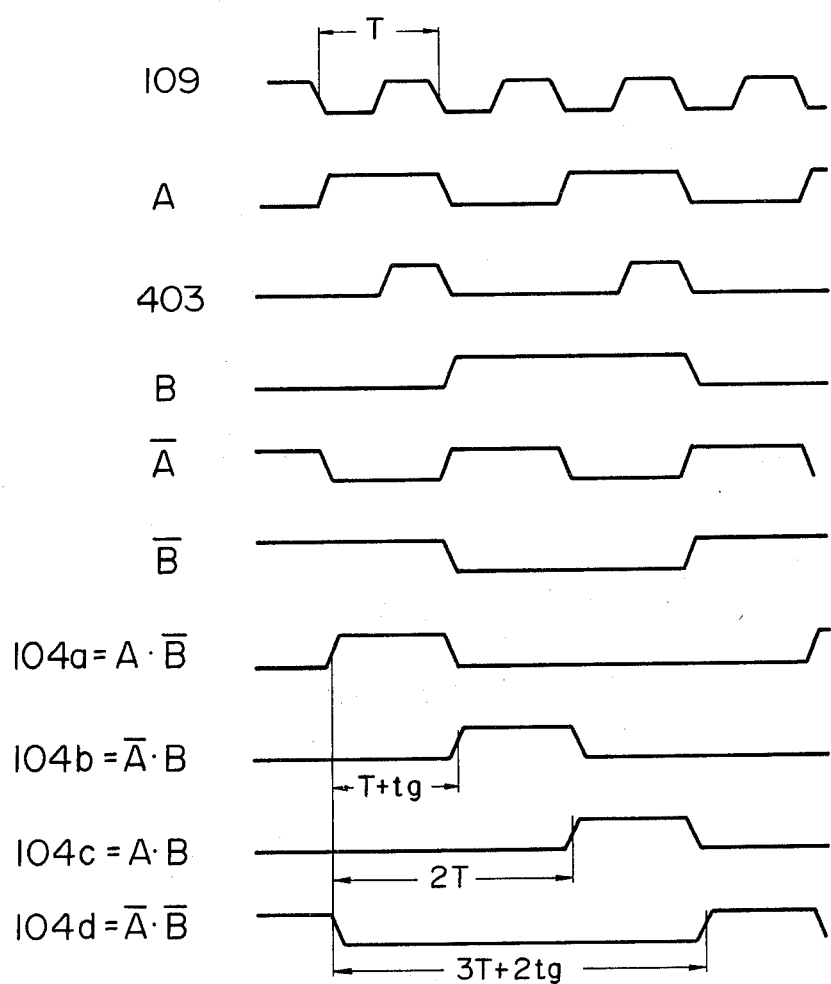
FIG. 5 shows operational waveforms of the circuit of FIG. 4.
Figure 7:
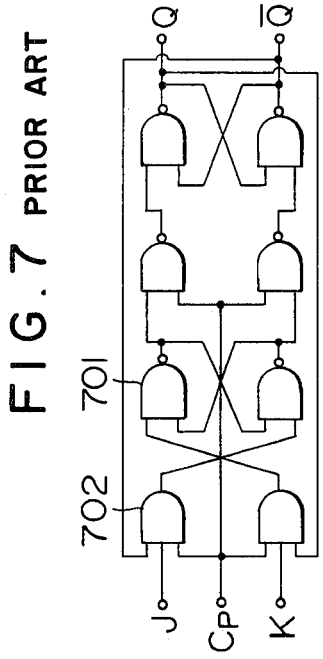
FIG. 7 shows a circuit diagram of a master-slave type J-K flip-flop.
Figure 6:
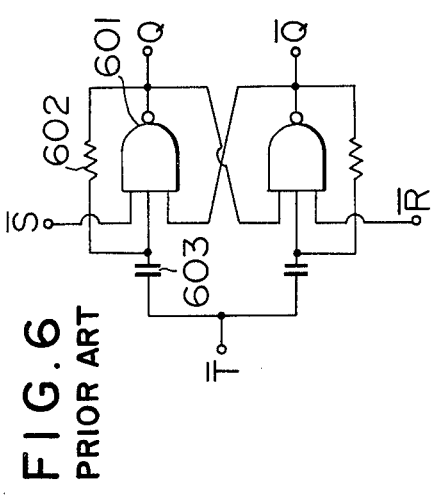
FIG. 6 shows a circuit diagram of a T-type F-F.
Figure 10:
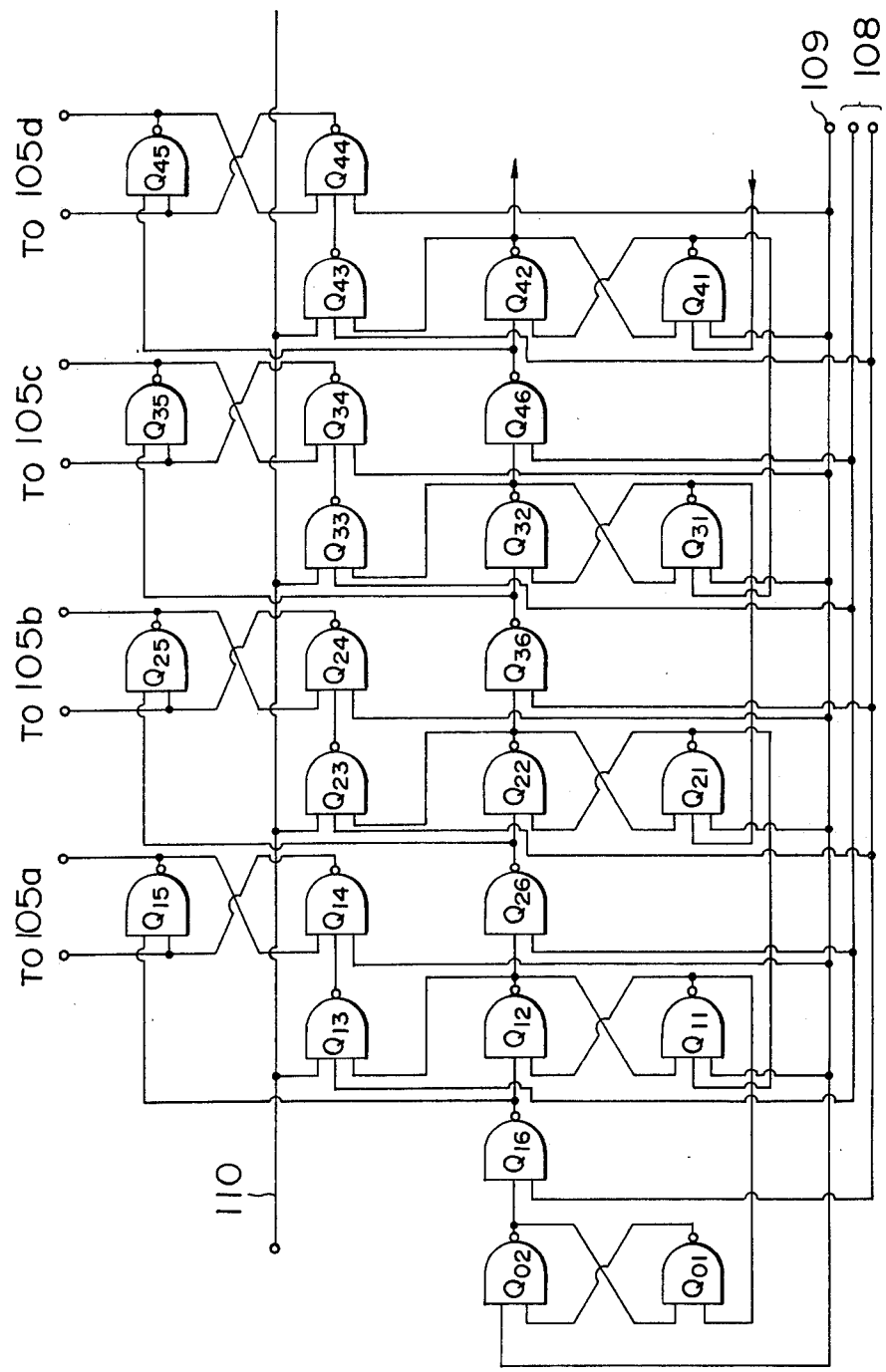
FIG. 10 shows a circuit diagram of a second embodiment of the logic circuit of the present invention.
Figure 11:
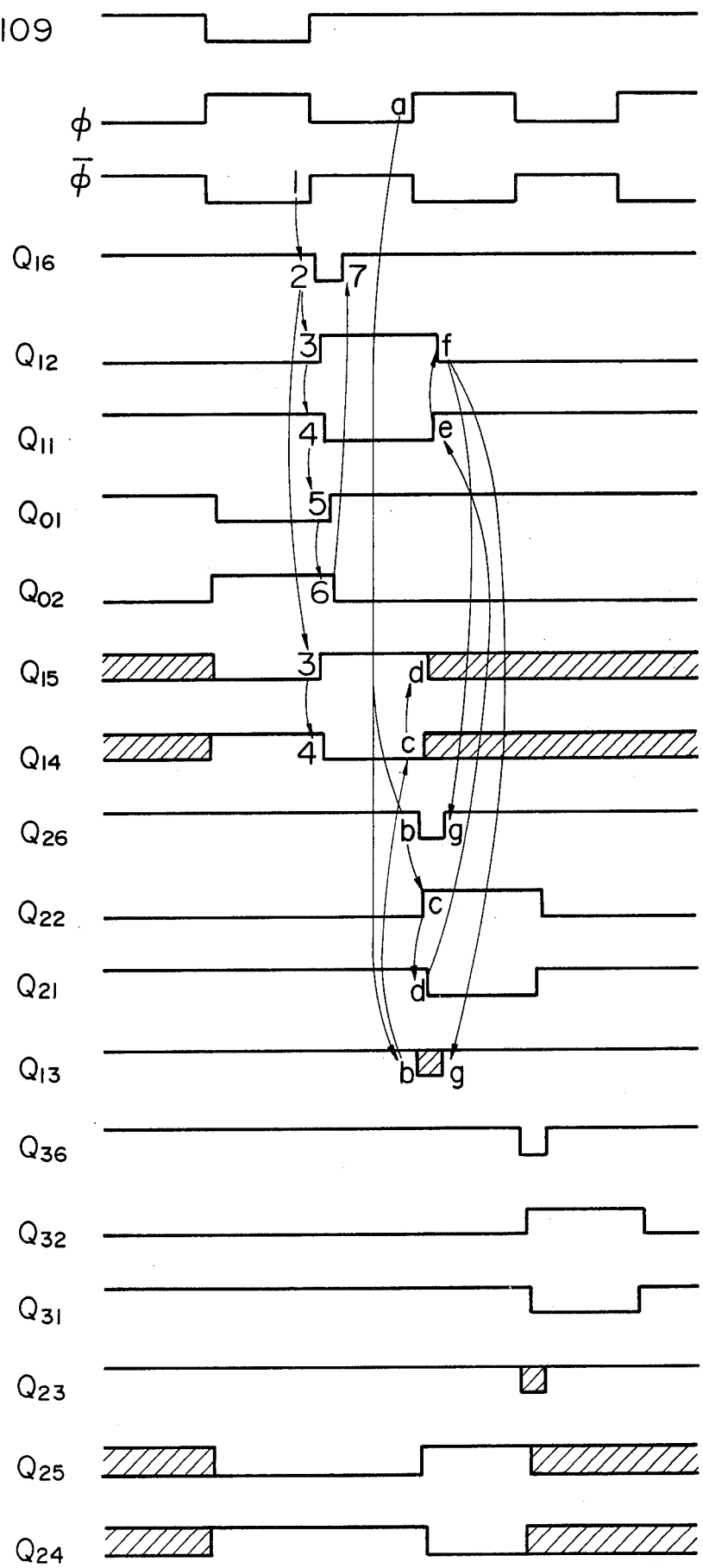
FIG. 11 shows operational waveforms of the circuit of the second embodiment.

FIG. 10 shows a second embodiment of the present invention and shows a circuit diagram of the SAR for the A/D converter which employs the logic circuit for generating the shift pulse sequence in accordance with the first embodiment shown in FIG. 8. FIG. 11 shows output waveforms numbered correspondingly. In the logic circuit shown in FIG. 10, the elements corresponding to the counter 103 and the memory 104 of the successive approximation A/D converter shown in FIG. 1 are designated by like numerals. In FIG. 10, NAND gates $Q_{11}$, $Q_{12}$ and $Q_{16}$ correspond to the shift counter 103a, NAND gates $Q_{21}$, $Q_{22}$ and $Q_{26}$ correspond to the shift counter 103b, and the other gates correspond in a similar way. On the other hand, NAND gates $Q_{13}$, $Q_{14}$ and $Q_{15}$ corresponds to the memory 104a, NAND gates $Q_{23}$, $Q_{24}$ and $Q_{25}$ correspond to the memory 104b, and the other gates correspond in a similar way. The NAND gates $Q_{01}$, $Q_{02}$; $Q_{11}$, $Q_{12}$; . . . $Q_{41}$, $Q_{42}$ and $Q_{14}$, $Q_{15}$; . . . $Q_{44}$, $Q_{45}$ constitute the R-S F-F's respectively and $Q_{16}$, $Q_{26}$, . . . $Q_{46}$ are coupling gates for interconnecting the R-S F-F's. In the present embodiment, the output of the NAND gate $Q_{11}$ is fed back to the input of $Q_{01}$, the output of $Q_{21}$ is fed back to the input of $Q_{11}$, and so on. Clock pulses $\phi$ and $\bar{\phi}$ of opposite phase to each other are applied to the terminals 108.

In the present embodiment, each of the R-S F-F's corresponding to the respective bits is alternately clocked by two-phase clock pulses $\phi$ and $\bar{\phi}$ to maintain the shift pulse width driven by the current-steering switch to be constant for each of the bits.

The operation is now explained with reference to FIG. 11. First, only the R-S F-F $Q_{01}$, $Q_{02}$ is set by the reset pulse 109 while other R-S F-F's are all reset. At a leading edge ① of the clock pulse $\bar{\phi}$, $Q_{16}$ flips and $Q_{12}$ flips in response thereto and then $Q_{11}$ flips, $Q_{01}$ flips, $Q_{02}$ flips and $Q_{16}$ again flips. Thus, the flip interval of $Q_{16}$ is equal to delay time of 5 tg which corresponds to a total delay time of five NAND gates. On the other hand, in response to the flip of $Q_{16}$, $Q_{15}$ flips and $Q_{14}$ flips. At a leading edge ⓐ of the next clock pulse $\phi$, $Q_{13}$ flips (if the summing line 110 is at the "H" level). Then, $Q_{14}$ flips and $Q_{15}$ flips. The output 110 of the comparator is applied to $Q_{13}$. If it is of "L" level, $Q_{13}$ does not flip at the leading edge of the clock pulse $\phi$ and hence $Q_{14}$ and $Q_{15}$ also do not flip. Thus, $Q_{14}$ and $Q_{15}$ have stored the output of the comparator. In FIG. 11, hatching is drawn to those portions which depends on the "H" and "L" levels of the comparator output. At the leading edge ⓐ of the clock pulse $\phi$, $Q_{26}$ also flips. In response thereto, $Q_{22}$, $Q_{21}$, $Q_{11}$; $Q_{12}$ and $Q_{26}$ flip sequentially and $Q_{26}$ restores to its original state. Thus, the flip interval of $Q_{26}$ is equal to delay time 5 tg which corresponds to a total delay time of five NAND gates.

On the other hand, as $Q_{12}$ flips, $Q_{13}$ restores to its original state. Thus, a time interval during which $Q_{13}$ holds the content of the comparator is equal to 5 tg like $Q_{26}$. As a consequence, the latch circuit comprising $Q_{14}$ and $Q_{15}$ may latch in the hold interval 5 tg of $Q_{13}$. The generation of the shift pulses for one bit and the memory operation have thus been described. Similar operations are repeated for the second and subsequent bits.

As described above, in the logic circuit of the second embodiment of the present invention, the R-S F-F's for the respective bits are alternately driven by the two-phase clock pulses $\phi$ and $\bar{\phi}$, and they are reset again by the feedback from the R-S F-F's of the respective bits. As a result, the shift pulse width of each of the bits is equal to the leading edge interval of the two-phase clock pulses or the clock pulse width.

In the logic circuit of the present embodiment, the trailing edges of the shift pulse sequence which is the output from the NAND gate circuits $Q_{12}$, $Q_{22}$, $Q_{32}$, . . . overlap the leading edges of the next sequential shift pulses (for example, ⓕ of $Q_{12}$ and ⓒ of $Q_{22}$ in FIG. 11). However, since the shift pulses are applied to the latch circuits comprising $Q_{13}$–$Q_{15}$, $Q_{23}$–$Q_{25}$, $Q_{33}$–$Q_{35}$, . . ., the shift pulse sequence for driving the current-steering switches of the A/D converter has no overlapped portions as shown in FIG. 11 by $Q_{14}$, $Q_{15}$, $Q_{24}$ and $Q_{25}$. Accordingly, a logic circuit which has a constant shift pulse generation interval and is suitable for use in the SAR circuit for the A/D converter is provided.

By using the logic circuit of the present embodiment as the SAR circuit, glitch and jitter caused by the delay time are overcome. With respect to operation stability, the prior art circuit has a write period of 3 tg for writing the comparator output to the set-preference type R-S F-F while the present circuit has a write period of 5 tg for writing the comparator output to the R-S F-F. Thus, the present circuit is stable in writing the comparator output while using the delay time of the NAND gates. In addition, the prior art circuit use the set-preference type R-S F-F's as the basic elements while the present circuit uses the R-S F.F's. Accordingly, the circuit configuration is simplified. Thus, when the logic circuit of the present embodiment is used in the A/D converter having the SAR circuit, an implementation in a monolithic IC is effectively done. This is particularly useful in an integrated injection logic circuit (IIL or $I^2L$) which can be integrated in the same semiconductor substrate of a bipolar transistor linear circuit.

Figure 12:
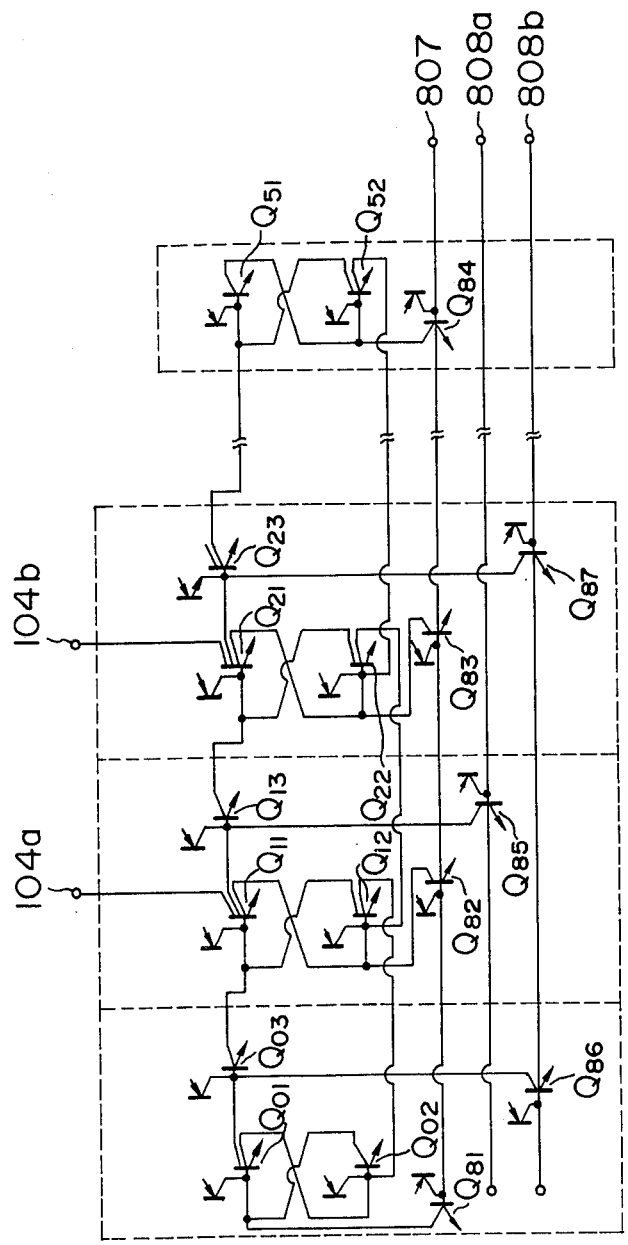
FIG. 12 shows a circuit diagram of a third embodiment of the logic circuit of the present invention.

FIG. 12 shows a circuit diagram in which the logic circuit of the first embodiment shown in FIG. 8 is constructed by $I^2L$ circuits.

In FIG. 12, like numerals to those shown in FIG. 8 denote like gates or terminals, and $Q_{31}$–$Q_{33}$ and $Q_{41}$–$Q_{43}$ of FIG. 8 are omitted. In order to apply a reset pulse 807 and the clock pulses supplied to terminals 808a and 808b to the respective gates, gates $Q_{81}$–$Q_{87}$ are provided as applying means inherent to the $I^2L$. Accordingly, the pulse drive is of opposite phase to that of FIG. 8.

In FIG. 12, pnp transistors act as injectors for injecting currents to npn transistors. The npn transistors act as inverters and emitters thereof are connected to a common bias potential in a region formed in a common semiconductor substrate.

Figure 13:
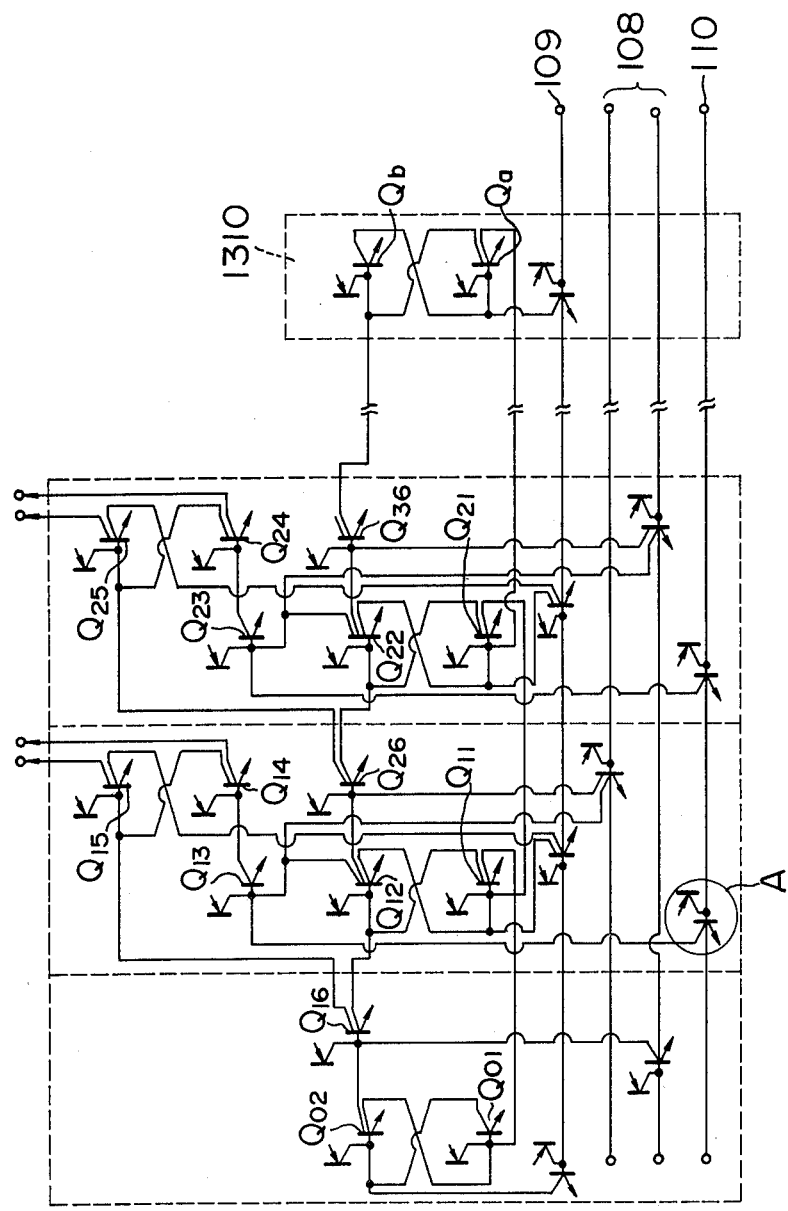
FIG. 13 shows a circuit diagram of a fourth embodiment of the logic circuit of the present invention.

FIG. 13 shows a circuit diagram in which the logic circuit of the second embodiment shown in FIG. 10 is implemented by I²L gates. In FIG. 12, pnp transistors supply injection currents to npn transistors. The npn transistors act as inverters and emitters thereof are connected to a common bias potential in a common semiconductor substrate. The basic operation is identical to that of the NAND gates shown in FIG. 10. For the sake of convenience, the inverters having like functions to those of the NAND gates shown in FIG. 10 are designated by like symbols.

Differences from the NAND gate arrangement of FIG. 10 reside in that a feedback latch (R-S F-F) $Q_a$, $Q_b$ extending from the final stage to the preceding stage is added and that the I²L gates are added one for each of the gates which apply the reset pulse, the clock pulses and the comparator output.

What is to be noted in the logic circuits of the embodiments of the present invention shown in FIGS. 12 and 13 which use the I²L gates is the number of multi-collectors of the npn inverter transistors.

As is explained in many articles, the inverter of the I²L gate uses a collector electrode and an emitter electrode of an npn transistor used in a linear circuit in an inverse manner. Accordingly, in the I²L gate, electrons are injected from the collector to a base and hence injection efficiency is poor and a current amplification factor is low. The reduction of inverted $h_{fe}$ which represents the current amplification factor of the I²L gate causes insufficient absorption of injector current when the transistor is turned on. As a result, it causes a malfunction at the coupling to a succeeding stage transistor. Accordingly, in the design of the logic circuit using I²L gates, it is desirable in attaining a stable operation to reduce the number of multi-collectors as much as possible to prevent the reduction of the inverted $h_{fe}$. In the present embodiments, since the number of the multi-collectors is three at maximum as shown in FIGS. 12 and 13, a satisfactory result is attained with respect to the magnitude of the inverted $h_{fe}$ and operation stability.

The shift pulse generation circuit for generating pulse sequences of the different phases can be constructed by three NAND gates per pulse as shown in FIG. 8. In the prior art, the D-type F-F are cascade-connected to generate the pulse sequences of different phases. Such a construction needs six NAND gates per pulse. It may be constructed by the synchronous counter but it requires AND gates and inverters, which require a number of gates. In this respect, when the SAR circuit for the A/D converter is constructed by I²L gates in accordance with the logic circuit of the present invention, it requires nine gates per bit as shown in FIG. 13. On the other hand, if the SAR circuit of the same function is constructed by the D-type F-F's using the I²L gates, seventeen gates per bit are required. Accordingly, the logic circuit of the present invention can reduce the number of gates by a factor of 1.9 in comparison with the prior art logic circuit. When a design rule for a photomask of IC is set to 5 μm, the size can be reduced by the factor of 2.4. This fact is particularly important when the I²L gates are integrated in the same semiconductor substrate of other analog signal processing circuits. Since the area occupied by the analog signal processing circuit is constant whether the logic circuit of the present invention is used or the prior art logic circuit is used, the size of the IC chip may vary depending on the size and the shape of the logic circuit area. For example, when a 14-bit SAR circuit is constructed by the I²L gate in accordance with the logic circuit of the present invention, the logic circuit can be accommodated in an area of 380 μm×3.6 mm. On the other hand, when the SAR circuit of the same function is constructed by the D-type F-F's using I²L gates, it takes an area of 430 μm×7.1 mm. Thus, the IC chip size is 3.6 mm square for the former and 7.1 mm square for the latter. Since vacant spaces exist in the 7.1 mm square chip, the SAR circuit will actually not be arranged in a laternal line but folded at a certain intermediate point. However, the folding causes uneven distribution of voltage drop along an Al metalization, which in turn causes malfunction particularly in the logic elements like I²L which are driven by small currents.

Accordingly, the logic circuit of the present invention not only reduces the number of gates but has an important effect of providing stable operation in the high integration density IC chip in which both the analog and digital circuits are integrated in a common semiconductor substrate.

In the logic circuit of the present invention, the flip-flop circuits sequentially feed back the outputs to their preceding stage. In such a feedback type logic circuit, it is a condition of the operation of the preceding stage that the succeeding stage operates correctly. In the logic circuit of the present invention, however, the operation of the preceding stage is maintained even if the succeeding stage flip-flop malfunctions because the feedback from the succeeding stage flip-flop functions to reset the preceding stage and succeeding stage flip-flops. Accordingly, although the preceding stage is not reset when the succeeding stage malfunctions but the correct operation of the stage before the preceding stage is maintained. In this respect, the logic circuit of the present invention has more design redundancy than the prior art feedback type circuit.

While the write timing of the comparator output 110 to the latch circuit is established by the gate delay time in the embodiment of FIG. 10, it should be understood that pulses corresponding to the outputs of $Q_{16}$, $Q_{20}$, $Q_{36}$ and $Q_{46}$ may be externally applied.

FIG. 14 shows a fifth embodiment of the present invention. If differs from the second embodiment of the present invention shown in FIG. 10 in that the number of gates is further reduced when it is implemented by I²L gates. In FIG. 14, like numerals to those shown in FIG. 10 denote like elements. In FIG. 10, the read-in gates $Q_{13}$, $Q_{23}$, . . . $Q_{43}$ for the comparator output 110 are timed by the clock pulses $\phi$ and $\bar{\phi}$ while the present embodiment uses the shift pulses of the next sequential stages. More particularly, the output of $Q_{22}$ is applied to the input of $Q_{13}$, the output of $Q_{32}$ is applied to the input of $Q_{23}$, and so on. Accordingly, when the circuit is implemented by I²L gates, the embodiment of FIG. 10 requires I²L gates (shown by A in FIG. 13) one for each of the gates $Q_{13}$, . . . $Q_{43}$ to apply the clock pulses while the present embodiment requires no such I²L gate and hence it can reduce the member of I²gates by a number corresponding to the number of conversion bits.

As described hereinabove, since the logic circuit of the present invention uses the simple R-S F-F's as the basic elements, no complex gates such as the set-preference R-S F-F's or the D-type F-F's used in the prior art circuits are necessary. In addition, since the flip-flop circuits of the logic circuit of the present invention are alternately driven by the two-phase clock pulses and the outputs are fed back such that the preceding stages are successively reset by the succeeding stages, the pulse width of the shift pulses of the corresponding bits does not vary. Consequently, the jitter error of the digital output which has been a serious problem in the prior art circuit is eliminated and the conversion accuracy and the conversion speed are improved.

In the prior art circuit, since two F-F's correspnding to two bits are fed back in pair, the selection of the number of bits is limited to a power of two. In the logic circuit of the present invention, since each of the F-F's is fed back, any number of bits can be selected. The logic circuit of the present invention is particularly useful to the SAR circuit for the A/D converter. In integrating the linear circuit for processing the analog signal and the logically controlling digital circuit, the $I^2L$ gates which are compatible with the manufacturing process of the bipolar transistors can be used. In order to prevent operation instability due to the reduction of the inverted $h_{fe}$, the logic circuit of the present invention uses three or less number of multi-collectors. This enables stable logic operation and high speed operation.

With respect to the stability of the operation, the logic circuit of the present invention has a longer write time of the latch circuit than the prior art circuit and hence enables a reliable write operation.

In the logic circuit of the present invention, the outputs of the shift pulses for driving the current-steering switches are taken from the memory latch circuits which are separate from the F-F's for generating the shift pulses. Accordingly, the numbers of fan-outs of the gates are balanced and operation stability is further enhanced.

The logic circuit of the present invention has a high utility value and can be applied to not only the successive approximation type A/D converter but also to other register arrangements.

We claim:

1. A shift register circuit comprising:
    means for supplying a pair of clock pulse signals having different phases;
    a first flip-flop having an input and an output;
    a second flip-flop having first and second inputs and first and second outputs which are 180° out-of-phase, one of said outputs being directly connected to the input of said first flip-flop;
    a third flip-flop having first and second inputs and first and second outputs which are 180° out-of-phase, one of said outputs being directly connected to the first input of said second flip-flop;
    a first gate coupling the output of said first flip-flop to the second input of said second flip-flop;
    a second gate coupling the other of the outputs of said second flip-flop to one of the inputs of said third flip-flop;
    said first and second gates being suitably controlled on and off by the different phases of said clock pulse signals; and
    said first flip-flop being set and said second and said third flip-flops being reset by a reset signal.

2. A shift register circuit according to claim 1 further comprising latch circuits one for each of said flip-flops, said latch circuits being driven by at least one of the outputs of the respective flip-flops.

3. A shift register circuit according to claim 1 wherein said latch circuits each comprises a write gate circuit which determines a write state of an external signal in response to the output of a respective flip-flop and a flip-flop circuit for holding the write state of said write gate circuit, the write gate circuits and said first and second gates being driven by the clock pulse signals of different phases.

4. A shift register circuit according to claim 3 wherein each said write gate circuit writes an external signal in response to a clock pulse signal of different phase from a clock pulse signal applied to the coupling gate of the associated flip-flop and the output of the flip-flop which is next in sequence to the associated flip-flop.

5. A shift register circuit according to claim 3 wherein each said write gate circuit writes an external signal in response to an output of a flip-flop which is next in sequence to a flip-flop associated with said write gate circuit and an output of a flip-flop which is next in sequence to said sequentially next flip-flop.

6. A logic circuit according to claim 3 wherein said write gate circuits are driven by external pulses.

* * * * *